United States Patent [19]
Shin et al.

[11] Patent Number: 5,459,692
[45] Date of Patent: Oct. 17, 1995

[54] SEMICONDUCTOR MEMORY DEVICE AND METHOD FOR READING DATA THEREFROM

[75] Inventors: Yasuhiro Shin; Hidetaka Kodama, both of Tokyo, Japan

[73] Assignee: Oki Electric Industry Co., Ltd., Tokyo, Japan

[21] Appl. No.: 199,163

[22] PCT Filed: Jul. 6, 1993

[86] PCT No.: PCT/JP93/00928

§ 371 Date: Feb. 25, 1994

§ 102(e) Date: Feb. 25, 1994

[87] PCT Pub. No.: WO94/01868

PCT Pub. Date: Jan. 20, 1994

[30] Foreign Application Priority Data

Jul. 7, 1992 [JP] Japan ..................... 4-179880

[51] Int. Cl.⁶ .................................. G11C 17/00
[52] U.S. Cl. ................. 365/203; 365/94; 365/104; 365/189.01
[58] Field of Search .............. 365/203, 104, 365/103, 94, 189.01, 194

[56] References Cited

U.S. PATENT DOCUMENTS 4,240,151 12/1980 Kawagoe .................. 365/104
4,858,194 8/1989 Terada ...................... 365/203

FOREIGN PATENT DOCUMENTS

| | | |
|---|---|---|
| 55-77091 | 6/1980 | Japan .................. 365/104 |
| 60-138799 | 7/1985 | Japan .................. 365/104 |
| 61-50291 | 3/1986 | Japan . |
| 61-180998 | 8/1986 | Japan .................. 365/104 |
| 63-122095 | 5/1988 | Japan . |

*Primary Examiner*—Joseph A. Popek
*Assistant Examiner*—Son Mai
*Attorney, Agent, or Firm*—Edward D. Manzo

[57] ABSTRACT

A method for reading data for a semiconductor memory device including steps of selecting a plurality of memory locations on which data are stored by word-lines and bit-lines, and reading the data from the bit-lines is provided, which comprises the steps of precharging the word-line by activating the first precharge signal; precharging the bit-line by activating a second precharge signal after a lapse of predetermined time since the first precharge signal has been activated; selecting a predetermined memory location in response to address signals; and reading data stored on the memory location from the bit-line by inactivating the first and second precharge signals.

12 Claims, 6 Drawing Sheets

FIG. 2 PRIOR ART

NMOS          SIMPLIFIED SKETCH OF NMOS

FIG. 3

PMOS          SIMPLIFIED SKETCH OF PMOS

FIG. 4

CLK  FIG. 5A PRIOR ART

ADDRESS X1~X4 Y1~Y3  FIG. 5B PRIOR ART

OUT  FIG. 5E PRIOR ART

FIG. 6

SEMICONDUCTOR MEMORY DEVICE AND METHOD FOR READING DATA THEREFROM

TECHNICAL FIELD

The invention relates to a semiconductor memory device and, more particularly, to a Read Only Memory (hereinafter, called as ROM) and a method for reading the data therefrom.

BACKGROUND ART

Figure 1A:
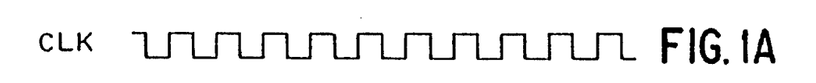
FIG. 1 is a timing chart explaining a method of reading data according to the present invention.
Figure 1B:
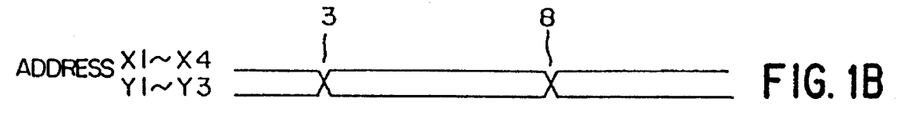
Figure 1C:
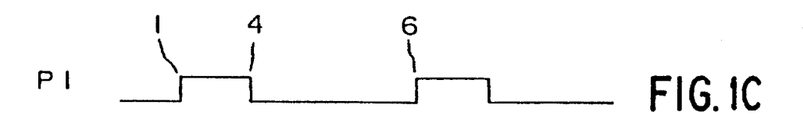
Figure 1D:
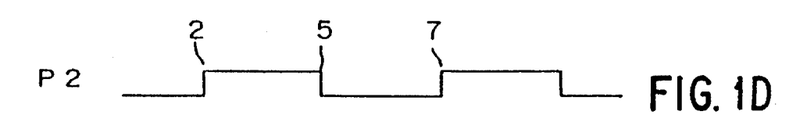
Figure 1E:
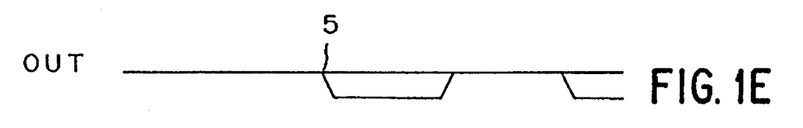
Figure 2:
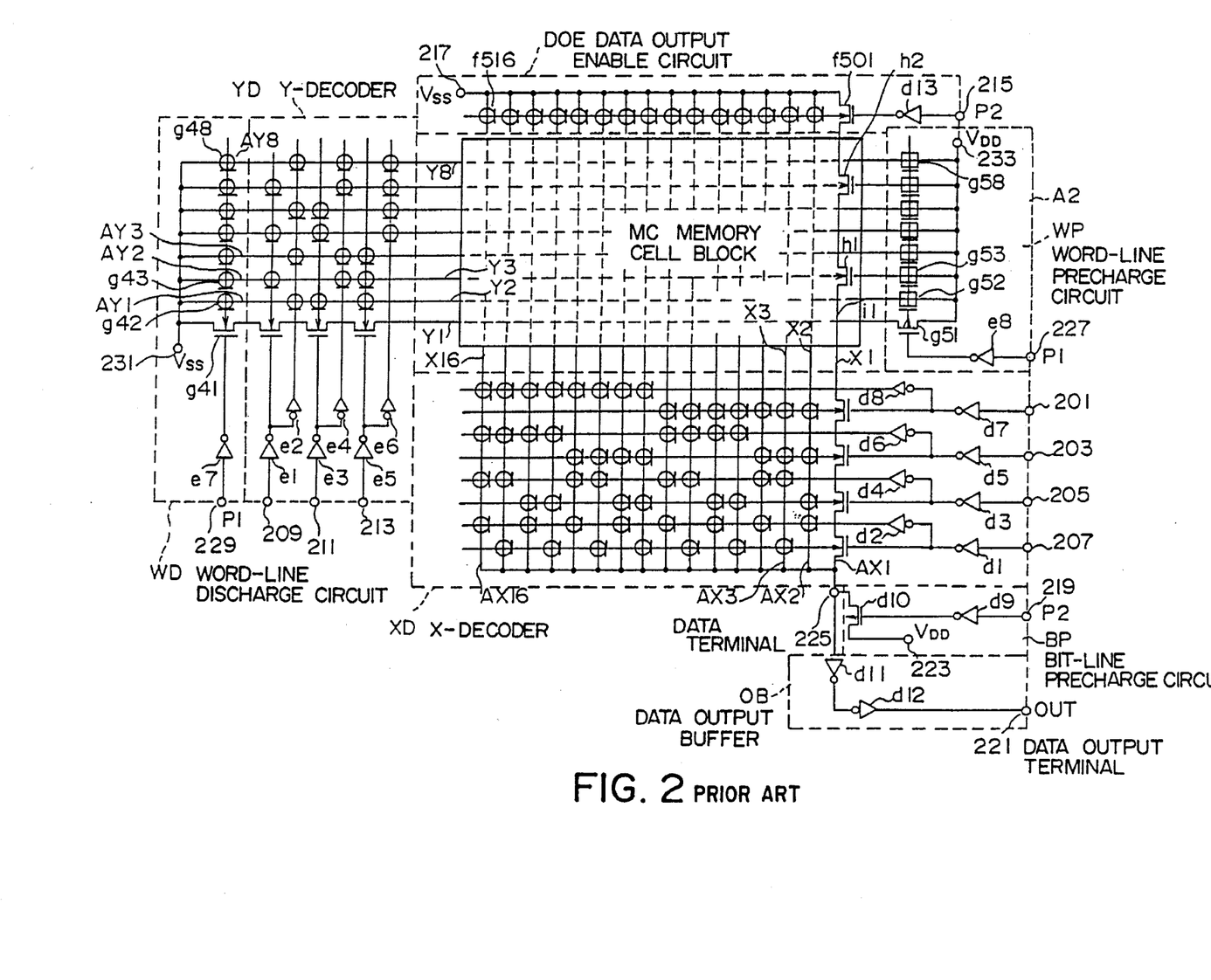
FIG. 2 is a circuit diagram illustrating a conventional ROM.
Figure 3:
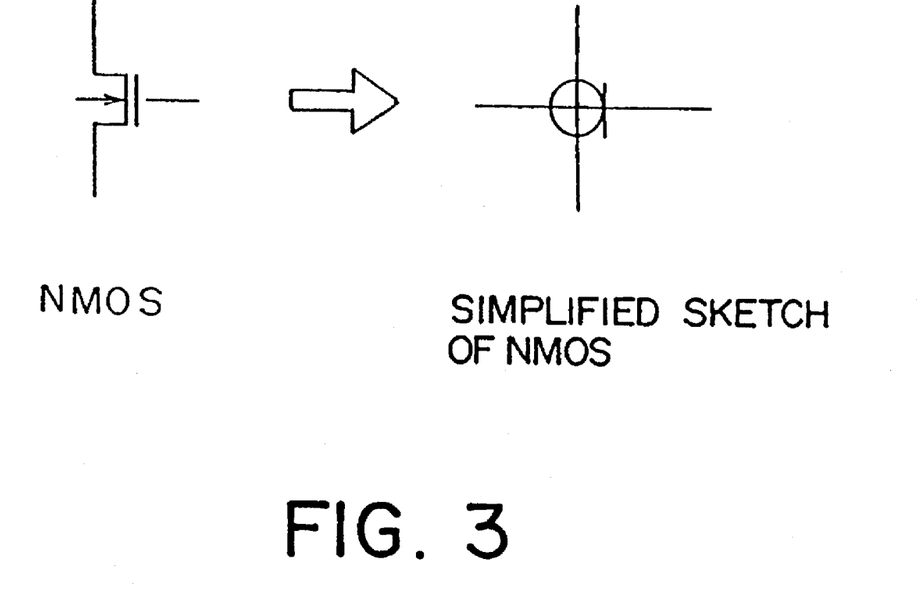
FIG. 3 is a diagram explaining a simplified sketch of an NMOS shown in FIG. 2.
Figure 4:
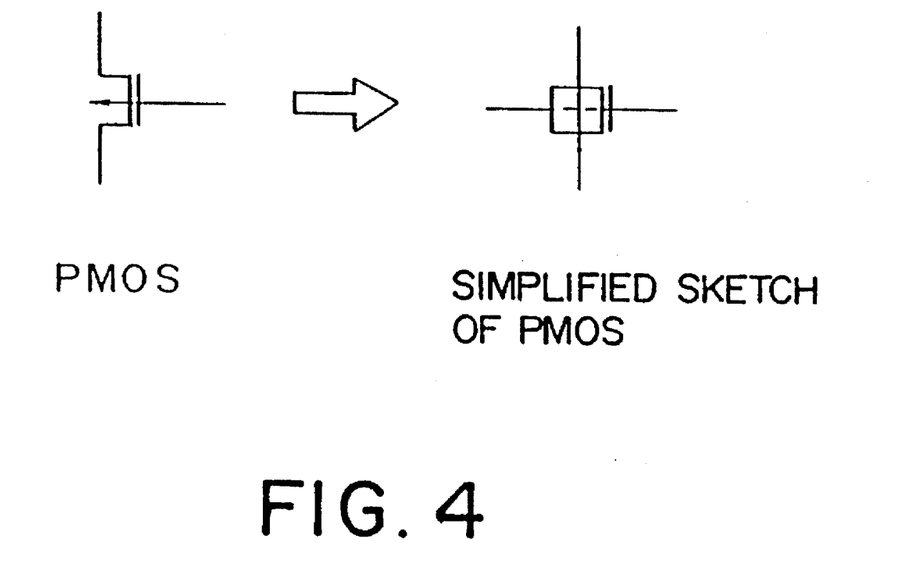
FIG. 4 is a diagram explaining a simplified sketch of a PMOS shown in FIG. 2.
Figure 5A:
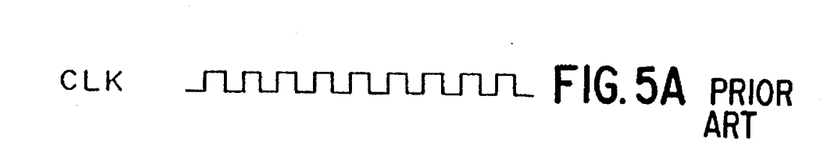
FIG. 5 is a timing chart explaining a conventional method for reading data for a conventional ROM.
Figure 5B:
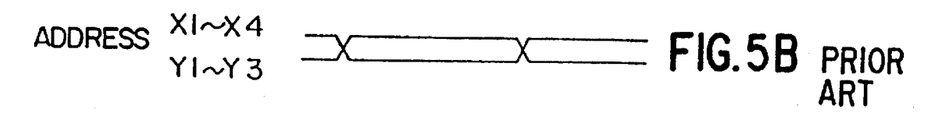
Figure 5C:
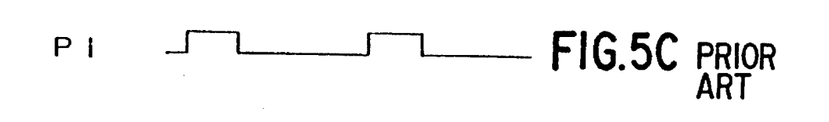
Figure 5D:
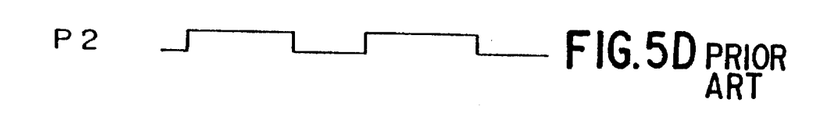
Figure 5E:
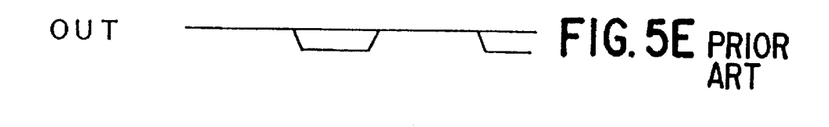

A well known ROM in general is shown in FIG. 2. Referring to FIG. 2, a circuit structure of the ROM will be described hereinbelow. In order to simplify the description, some of N-channel MOS transistors (hereinafter, NMOS) are represented by a simplified sketch as shown in FIG. 3, and some of P-channel MOS transistors (hereinafter, PMOS) are also represented by a simplified sketch as shown in FIG. 4.

The ROM shown in FIG. 2 is constituted of a memory cell block MC for storing data, a Y-decoder YD for selecting (activating) word-lines Y1 to Y8, and an X-decoder XD for selecting bit-lines X1 to X16 (reference numerals of word-lines Y4 to Y7 and bit-lines X4 to X15 are not shown in FIG. 2). The Y-decoder YD is connected to a word-line discharge circuit WD in which a voltage of $V_{SS}$ level as a ground potential is supplied to the word-lines Y1 to Y8. And the word-lines Y1 to Y8 are connected to a word-line precharge circuit WP in which a voltage of $V_{DD}$ level as a power supply potential is supplied thereto (reference numerals of decode-lines AY4 to AY7 are not shown in FIG. 2).

On the other hand, decode-lines AX1 to AX16 in the X-decoder XD are commonly connected to a data terminal 225 (reference numerals of decode-lines AX4 to AX15 are not shown in FIG. 2). Then, the data terminal 225 is connected to a bit-line precharge circuit BP, in which the voltage of $V_{DD}$ level is supplied to the bit-lines X1 to X16, and further, to a data output terminal 221 through a data output buffer OB. Further, the bit-lines X1 to X16 are connected to a data output enable circuit DOE in which the voltage of $V_{SS}$ level is supplied thereto.

Next, each circuit structure in the ROM will be described in detail.

The memory cell block MC has a capacity of 128 bits and memory locations defined at cross-over positions at which respective word-lines and bit-lines intersect with each other. Then, NMOSs for storing data are arranged on the respective memory locations. For example, NMOSs h1 and h2 are connected in series to the bit-line X1 so that a gate of the NMOS h1 is connected to the word-line Y3 and a gate of the NMOS h2 is connected to the word-line Y7. That is, the NMOS h1 is arranged on the memory location (X1, Y3) defined by the word-line Y3 and the bit-line X1, likewise, the NMOS h2 is arranged on the memory location (X1, Y7) defined by the word-line Y7 and the bit-line X1. Further, any other NMOSs for storing data are not substantially arranged on the other memory locations of the bit-line X1.

Although all of the memory locations of the bit-line X1 practically have NMOSs respectively, no NMOS apparently appear except the NMOSs h1 and h2 by forming short-circuit between the sources and the drains with aluminum wire or the like, otherwise, by forming quasi short-circuit by using a method of ion implantation.

The Y-decoder YD is constituted of Y address terminals 209, 211, 213 to which Y address signals are provided, inverters e1 to e6 for inverting the Y address signals, and Y decode-lines AY1 to AY8 respectively connected to the word-lines Y1 to Y8. Each of the decode-lines is constituted of three NMOSs connected in series to one another, therefore, the Y-decoder YD is constituted of 24 NMOSs in total. These NMOSs are turned on in response to the Y address signals provided to Y address terminals 209, 211, 213.

On this moment, there exists only one Y decode-line on which all the three NMOSs connected in series are turned on. It is selected, a word-line connected to the selected Y decode-line.

The word-line discharge circuit WD is constituted of a precharge signal input terminal 229 to which a precharge signal P1 is provided, an inverter e7, NMOSs g41 to g48, and a $V_{SS}$ terminal 231 to which the voltage of $V_{SS}$ level is supplied (reference numerals of NMOSs g44 to g47 are not shown in FIG. 2). Each source of the NMOSs g41 to g48 is commonly connected to the $V_{SS}$ terminal 231, each drain is connected to respective decode-lines AY1 to AY8, and each gate is commonly connected to an output terminal of the inverter e7. Then, the word-line discharge circuit WD supplies $V_{SS}$ level (discharging) to respective decode-lines AY1 to AY8 in response to the precharge signal P1 changing to a L level. As a result, the level of the Y decode-line selected by the Y address signal is turned to $V_{SS}$ level, and the level of the Y word-line connected to the Y decode-line is turned to $V_{SS}$ level. That is, the word-line discharge circuit WD discharges the level of the word-line selected by the Y address signal in response to the precharge signal P1 changing to the L level.

On the other hand, the word-line precharge circuit WP is constituted of a precharge signal input terminal 227 to which the precharge signal P1 is provided, an inverter e8, PMOSs g51 to g58, and a $V_{DD}$ terminal 233 to which the voltage of $V_{DD}$ level is supplied (reference numerals of PMOSs g54 to g57 are not shown in FIG. 2). Each source of the PMOSs g51 to g58 is commonly connected to the $V_{DD}$ terminal 233, each drain is connected to respective word-lines Y1 to Y8, and each gate is connected to an output terminal of inverter e8. The word-line precharge circuit WP supplies the voltage of $V_{DD}$ level (precharging) to respective word-lines Y1 to Y8 in response to the precharge signal P1 changing to a H level.

The X-decoder XD is constituted of X address terminals 201, 203, 205, 207 to which X address signals are provided, inverters d1 to d8 for inverting the X address signals, X decode-lines AX1 to AX16 connected to the bit-lines X1 to X16 respectively. Each of the X decode-lines is constituted of four NMOSs connected in series to one another, therefore, the X-decoder XD is constituted of 64 NMOSs in total. Then, the NMOSs are turned on in response to the X address signals provided to X address terminals 201, 203, 205, 207. On this moment, there exists only one X decode-line on which the four NMOSs connected in series are turned on. It is selected, a bit-line connected to the selected X decode-line. The operation of the X-decoder is the same as that of the Y-decoder.

The bit-line precharge circuit BP is constituted of a precharge signal input terminal 219 to which a precharge signal P2 is provided, an inverter d9, PMOS d10, and a $V_{DD}$ terminal 223 to which the voltage of $V_{DD}$ level is supplied.

Then, the bit-line precharge circuit BP supplies $V_{DD}$ level to the data terminal 225 in response to the precharge signal P2 changing to the H level. As a result, an X decode-line selected by the X address signal is turned to $V_{DD}$ level, and only one of the bit-lines connected to the selected X decode-line is turned to $V_{DD}$ level (precharge).

Meanwhile, the data output enable circuit DOE is constituted of a precharge signal input terminal 215 to which the precharge signal P2 is provided, an inverter d13, and a $V_{SS}$ terminal 217 to which the voltage of $V_{SS}$ level is supplied. Each drain of the NMOSs f501 to f516 is connected to respective bit-lines X1 to X16, each source is commonly connected to the $V_{SS}$ terminal 217, and each gate is connected to an output terminal of the inverter d13. Then, the data output enable circuit DOE supplies $V_{SS}$ level to the respective bit-lines in response to the precharge signal P2 changing to the L level. As a result, a data on a memory location selected by the X address signal and the Y address signal appears at the data terminal 225 through the corresponding decode-line.

The data output buffer OB is constituted of two inverters d11 and d12, and a data output terminal 221. The data output buffer OB outputs the data (electric potential), which appears at the data terminal 225, from the data output terminal 221.

FIG. 5 is a timing charts illustrating waveforms of data read out from the above-mentioned ROM. In the method of reading data, the precharge signals P1 and P2 rise to the H level at the same time, thereby a word-line and a bit-line being precharged. Then, X and Y address signals are fixed, and the prescribed memory location is selected. Finally, the precharge signals P1 and P2 are fallen to the L level so that the data on the selected memory location are read out.

However, the method for reading data mentioned above has accompanied a problem that, when the read cycle operates at a higher speed, data on memory locations may not be accurately read out.

For example, in FIG. 2, when a data "1" on the memory location arranging the NMOS h1 (memory location arranging NMOS holds "1") is continuously read many times, the same bit-line is repeatedly precharged, therefore, even the source and the drain of the NMOS h2 arranged at a position far from the data terminal 225 are charged to $V_{DD}-V_{TN}$ level. And thereafter, when a data "0" on a memory location i1 shown in FIG. 2, for example, is read (memory location not arranging NMOS holds "0"), an electric charge which is charged to sources and drains of the NMOSs h1 and h2 in the last operation of reading data "1" can not be completely discharged in a short time, and further, a level of the data terminal 225 can not be completely turned to $V_{SS}$ level ("0") in some cases. That is, as the read cycle operates at a higher speed, the data "1" may be outputted from the data output terminal 221 in spite of the fact that the data "0" is read.

The phenomenon is remarkable revealed more and more when the read cycle is accelerated and the number of NMOSs for storing data increases.

The problem can be solved by reducing the number of columns of NMOSs for storing data and dividing the memory cell block into plural blocks. Such an attempt for solving the problem, however, is not preferable on the ground that dividing the memory cell block into plural blocks causes enlarged chip size of LSI so as to be required to provide plural X-decoders and Y-decoders.

Further, although it can be considered to extend a time period of turning on the NMOSs f501 to f516 which discharge electric potential of bit-lines, it is not also preferable because it can reduce the read speed of ROM.

DISCLOSURE OF THE INVENTION

It is an object of the present invention to provide a method for reading data in order to solve the above-mentioned problem and, in case of reading data on a memory location, and more particularly, to provide a method including the following steps of: precharging a word-line by activating a first precharge signal; precharging a bit-line by activating a second precharge signal after a lapse of predetermined time since the first precharge signal was activated; selecting a predetermined memory location in response to address signals; and finally reading data stored on the memory location from the bit-line by inactivating the first and second precharge signals.

It is another object of the present invention to provide a semiconductor memory device which performs a read operation of the above-mentioned method, and more particularly, which includes precharge signal generating circuit in order to control activation timing of the first and second precharge signals.

PREFERRED EMBODIMENTS OF THE INVENTION

FIG. 1 is a timing chart explaining a method for reading data according to the present invention. Referring to FIG. 1, the method for reading data according to the present invention will be described, and then, structure of a precharge signal generation circuit for performing the read operation will be described. However, a detailed description of the other circuits except the precharge generation circuit will be eliminated due to the same as those shown in FIG. 2.

At first, a precharge signal P1 rises to a H level at timing ①, thereby NMOSs g41 to g48 in a word-line discharge circuit WD entirely turn off and PMOSs g51 to g58 in a word-line precharge circuit WP entirely turn on in response to the precharge signal P1. Therefore, word-lines Y1 to Y8 are charged to $V_{DD}$ level supplied from a $V_{DD}$ terminal 233. Further, NMOSs for storing data in a memory cell block MC turn on in response to the H level supplied to each gate thereof. In addition, in case of timing ①, a precharge signal P2 is set to a L level. Accordingly, a PMOS d10 in a bit-line precharge circuit BP is in the off state and NMOSs f501 to f516 in a data output enable circuit DOE are in the on state, so that the electric charge stored on the bit-line selected by the previously determined address in a last read cycle is discharged.

Next, the precharge signal P2 rises to the H level at timing ②, thereby the PMOS d10 in the bit-line precharge circuit BP turns on and the NMOSs f501 to f516 in the data output enable circuit DOE turn off. Under the above condition being such, X and Y address signals are fixed at timing ③, thereby one of the word-lines Y1 to Y8 being set in a selective condition. Further, the bit-line selected by the X address signal is charged to $V_{DD}-V_{TN}$ level through a data terminal 225 and a decode-line.

Thereafter, when the precharge signal P1 falls to the L level at timing ④, the PMOSs g51 to g58 in the word-line precharge circuit WP turn off and the NMOSs g41 to g48 in the word-line discharge circuit WD turn on. Therefore, the level of only one word-line selected by the Y address signal is discharged to $V_{SS}$ level through a Y decode-line, so that only one NMOS for storing data connected to the word-line discharged to the $V_{SS}$ level turns off.

Then, when the precharge signal P2 falls to the L level at timing ⑤, the NMOSs f501 to f516 in the data output enable circuit DOE turn on and the PMOS d10 in the bit-line precharge circuit BP turns off. Then, data on a memory location selected by the X and Y address signals appears at the data terminal 225, so that the data is output to a data output terminal 221 through inverters d11 and d12.

Assuming that a NMOS for storing data h1 is selected by the X and Y address signals at timing ⑤. As both precharge signals P1 and P2 are set to the L level, the NMOS for storing data h1 will turn off and four NMOSs constituting a decode-line AX1 will turn on. Therefore, the data output terminal 225 is not electrically connected to a $V_{SS}$ terminal 217 and holds $V_{DD}$ level. Being set to $V_{DD}$ level indicates that the data on memory location where NMOS for storing data is arranged is set to "1". Then, the $V_{DD}$ level applied to the data terminal 225 is delivered to the output terminal 221 of a data output buffer OB and output externally as the data "1".

On the other hand, when a memory location i1 shown in FIG. 2 is selected by the X and Y address signals at timing ⑤. As both precharge signals P1 and P2 are set to the L level, the NMOSs for storing data h1 and h2 turn on and the four NMOSs constituting the decode-line AX1 also turns on. On the contrary to the last case, the data terminal 225, therefore, is electrically connected to the $V_{SS}$ terminal 217 and the level of the data terminal 225 is discharged to $V_{SS}$ level. Being set to $V_{SS}$ level indicates that the data on the memory location i1 is set to "0". Then, the $V_{SS}$ level applied to the data terminal 225 is delivered to the output terminal 221 of the data output buffer OB and output externally as the data "0".

Next, when only the precharge signal P1 rises at timing ⑥, the PMOSs g51 to g58 in the word-line precharge circuit WP turn on and the NMOSs g41 to g48 in the word-line discharge circuit WD turn off. Therefore, NMOSs for storing data in the memory cell block MC entirely turn on, so that all bit-lines X1 to X16 are electrically connected to the $V_{SS}$ terminal 217 and electric charges thereof are discharged. Then, after the discharge operation of the bit-lines has been completed, the bit-lines are precharged by raising the precharge signal P2 to the H level at timing ⑦. Then, an address of a memory location to be read next is fixed at timing ⑧.

As mentioned above, since the rise timings of the precharge signals P1 and P2 are set differently with each other and electric charges of bit-lines are discharged whenever data on memory locations is read out, unnecessary electric charges can not be stored to NMOSs for storing data. Therefore, even if the read-out speed is accelerated, data "0" can be accurately read after data "1" are continuously read many times. Further, the deference between the precharge signals P1 and P2 is only required to timing for rising to the H level, so that the read-out time does not increase.

Figure 6:
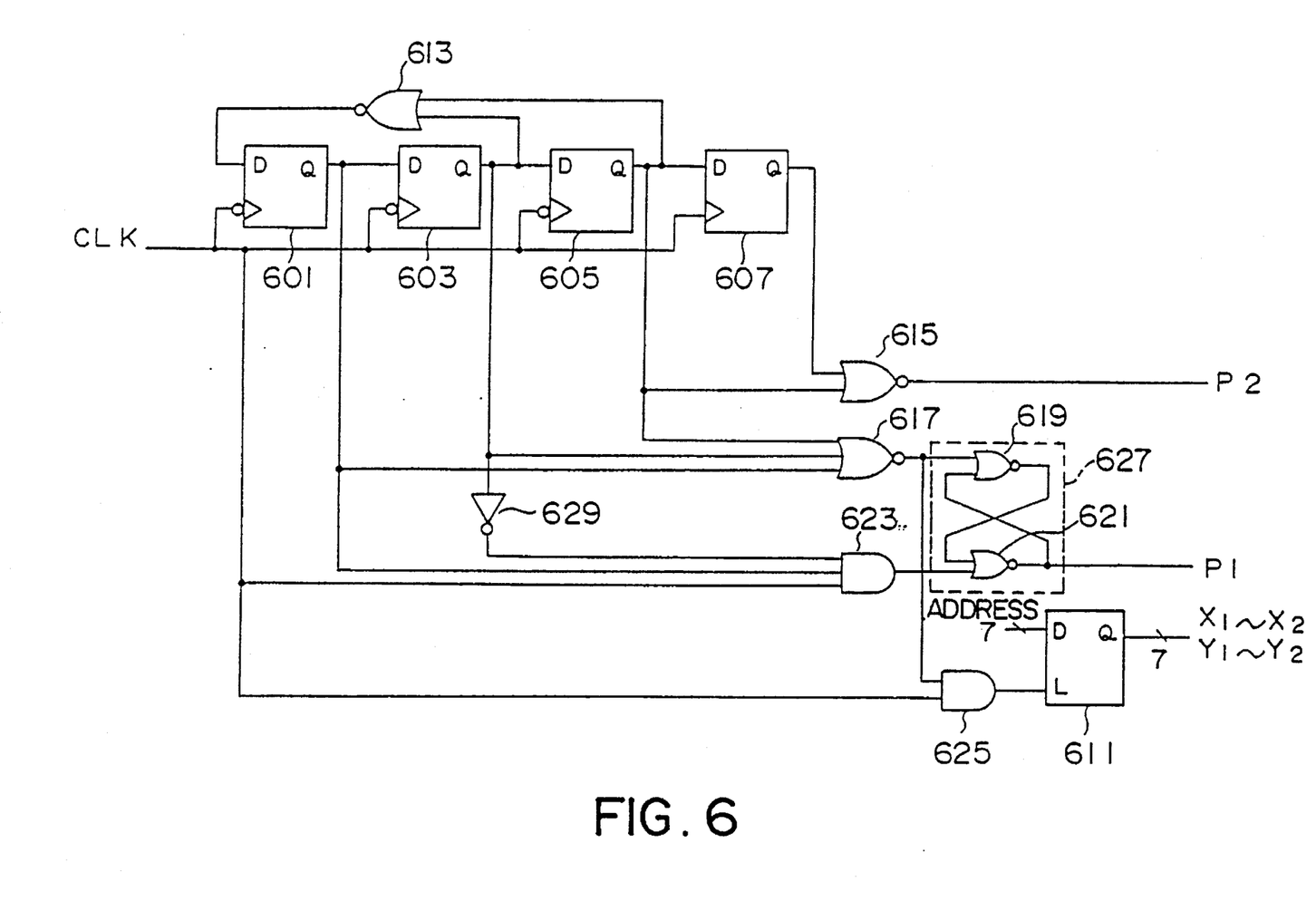
FIG. 6 is a detailed circuit diagram of a precharge signal generation circuit according to the present invention.
Figure 7A:
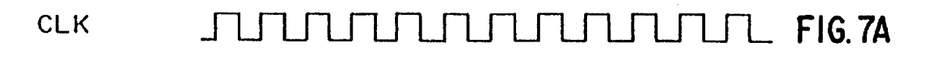
FIG. 7 is a timing chart explaining an operation of the precharge signal generation circuit.
Figure 7B:
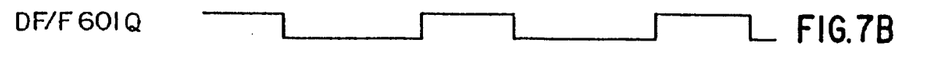
Figure 7C:
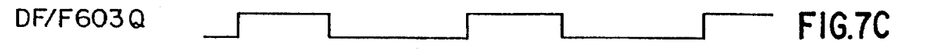
Figure 7D:
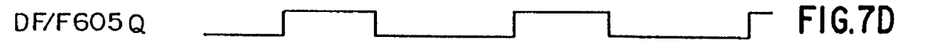
Figure 7E:
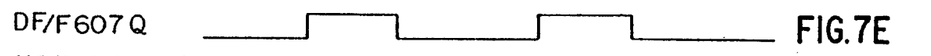
Figure 7F:
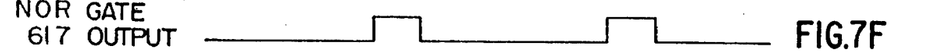
Figure 7G:
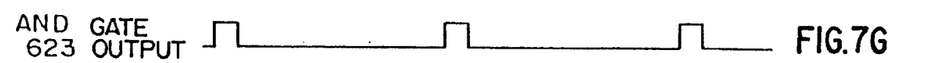
Figure 7H:
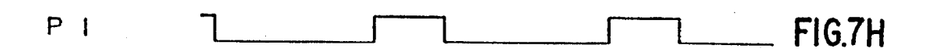
Figure 7I:
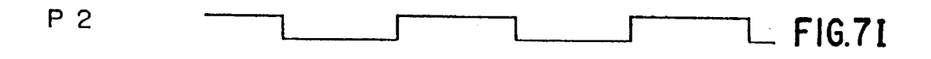
Figure 7J:
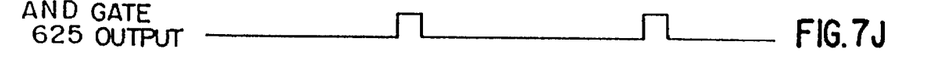
Figure 7K:
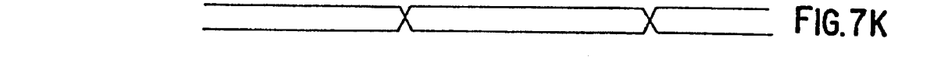

Next, referring to FIG. 6, a concrete circuit diagram of a precharge signal generation circuit for generating the precharge signals P1 and P2 will be described.

The precharge signal generation circuit incorporates data flip-flop circuits (hereinafter, called as DF/F) 601, 603, 605 for reading data delivered to input terminals D in response to a falling edge of a CLK signal, and a DF/F 607 for reading data delivered to the input terminals D in response to a rising edge of the CLK signal. Further, the precharge signal generation circuit also incorporates various kinds of gate circuits, an R-S flip circuit 627, and a data latch circuit 611 (CLK signal is also provided to a third input terminal of a three input AND gate 623 and a second input terminal of a two input AND gate 625).

An output terminal Q of the DF/F 601 is connected to the input terminal D of the DF/F 603, a third input terminal of a three input NOR gate 617, and a second input terminal of the three input AND gate 623, respectively. An output terminal Q of the DF/F 603 is connected to the input terminal D of DF/F 605, a second input terminal of a two input NOR gate 613, a second terminal of the three input NOR gate 617, and an input terminal of an inverter 629, respectively. An output terminal Q of the DF/F 605 is connected to the input terminal D of DF/F 607, a first input terminal of a two input NOR gate 613, a second input terminal of a two input NOR gate 615, and a first input terminal of the three input NOR gate 617, respectively. An output terminal Q of the DF/F 607 is connected to a first input terminal of the two input NOR gate 615.

The inverter 629 is connected to the output terminal Q of the DF/F 603 and a first input terminal of the three input AND gate 623.

The R-S flip flop circuit 627 (hereinafter, called as R-SF/F) is constituted of a two input NOR gates 619 and 621. Then, a first input terminal of the two input NOR gate 619, which serves as a set input terminal of the R-SF/F 627, is connected to an output terminal of the three input NOR gate 617, and a second input terminal of the two input NOR gate 621, which serves as a reset input terminal, is connected to an output terminal of the three input AND gate 623. And then, the precharge signal P1 is output from an output terminal of the two input NOR gate 621, which serves as an output terminal of the R-SF/F 627. Meanwhile, the precharge signal P2 is output from an output terminal of the two input NOR gate 615.

The data latch circuit 611 (hereinafter, called as D latch), in response to an output of the two input AND gate 625, holds address signals and outputs X and Y address signals at an output terminal Q.

Next, referring to FIG. 7, an operation of the precharge signal generation circuit will be described.

Assuming firstly that the output of the DF/F 605 is set to the H level, the outputs of the DF/Fs 601, 603 are set to the L level, and the CLK signal is set to the H level (at this time, both precharge signals P1 and P2 are set to the L level), when the CLK signal falls to the L level, the DF/F 605 reads the L level output from the DF/F 603, prior to the falling of the CLK signal, and outputs the L level at the Q output terminal Q. Similarly, the DF/F 603 reads the L level output from the DF/F 601 and outputs the L level at the Q output terminal Q. Since the NOR gate 613 has output the L level in response to the H level output from the DF/F 605 prior to the falling of the CLK signal, the DF/F 601 outputs the L level at the output terminal Q at the falling edge of the CLK signal. Since all of the DF/Fs 601, 603, 605 output the L level, the output of the three input NOR gate 617 is set to the H level. The H level is delivered to the first terminal of the two input NOR gate 619, i.e., the set input terminal of the R-SF/F 627. Now, since the output of the three input AND gate 623 holds the L level, the precharge signal P1 is turned to the H level. The precharge signal P1 having the H level is delivered to the second input terminal of the two input NOR gate 619, so that the precharge signal P1 can be preserved as the H level unless the H level is provided to the second input terminal of the two input NOR gate 621, i.e., the reset input terminal of the R-SF/F 627.

Next, when the CLK signal rises to the H level, the output of the DF/F 607 is set to the L level. Now, since the DF/F 605 outputs the L level, the output of the two input NOR gate 615, i.e., the precharge signal P2 is turned to the H level. Simultaneously, an output of the two input AND gate 625 turns to the H level, thereby the D latch circuit 611 starting to be output the address signals applied to the input terminal D of the D latch circuit 611.

As mentioned above, by shifting timings for activation (rise) of precharge signals P1 and P2, unnecessary electric charges stored at the preceding data read cycle is discharged.

Next, when the CLK signal falls to the L level, the output of the AND gate 625 is turned to the L level and the address signals are latched to the D latch circuit 611.

Further, since both the DF/F 603 and 605 output the L level, the output of the NOR gate 613 is turned to the H level. Therefore, the output of DF/F 601 is turned to the H level, thereby the output of the three input NOR gate 617, i.e., the set input of the R-SF/F circuit 627 being turned to the L level. However, the precharge signal P1 holds the H level on the ground that the three input AND gate 623 outputs the L level.

Then, when the CLK signal rises to the H level, the output of the three input AND gate 623 is turned to the H level. In other words, since the reset input of the R-SF/F circuit 627 is turned to the H level, the precharge signal P1 is turned to the L level, and then, precharge operation is completed to the Y decoder side.

Next, when the CLK signal falls to the L level, the output of the three input AND gate 623 is turned to the L level again.

When the CLK signal falls to the L level again after rising to the H level, DF/F 605 reads the H level of the output of the DF/F 603 and outputs the H level. Then, since the output of the DF/F 607 is turned to the H level, the output of the two input NOR gate 615, i.e., the precharge signal P2 is turned to the L level. And thereafter, the data is read out.

After the read-out has been completed, next read cycle starts.

INDUSTRIAL UTILIZATION

According to the present invention, since unnecessary electric charges of bit-lines can be discharged whenever data are read out, the data on memory locations can be accurately read out even though a speed of data read cycle may be accelerated.

For example, in case of a ROM having the 64 Kbits in memory size, even though the read cycle can be accelerated by about 30%, it is possible to read out the accurate data on the memory locations.

What is claimed is:

1. A semiconductor memory device comprising:

(a) a memory block having a plurality of memory locations for storing data;

(b) a plurality of word-lines for selecting the memory locations;

(c) a plurality of bit-lines for transmitting data on the memory locations;

(d) a Y-decoder having a plurality of Y decode-lines each of which couples to one of said word-lines, the Y decode-lines respectively selected in response to a first address signal;

(e) a first precharge circuit for precharging said word-lines in response to a first precharge signal being activated;

(f) a discharge circuit for discharging the selected Y decode-line in response to the first precharge signal being inactivated;

(g) an X-decoder having a plurality of X decode-lines each of which couples to one of said bit-lines, the X decode-lines respectively selected in response to a second address signal;

(h) a data output terminal commonly coupled to the plurality of bit-lines through the plurality of X decode-lines;

(i) a second precharge circuit for precharging said selected bit-lines through said data output terminal in response to a second precharge signal being activated;

(j) a data output enable circuit for supplying a predetermined voltage to the memory locations selected by the first and second address signals and for transferring data on the memory locations to said output terminal in response to the said second precharge signal being inactivated; and (k) a precharge signal generation circuit for generating the first precharge signal and the second precharge signal delayed for a predetermined interval of time relative to the first precharge signal in response to a reference clock signal.

2. The semiconductor memory device according to claim 1, wherein said precharge signal generation circuit comprises:

a first pulse signal generation circuit for generating a first pulse signal;

a second pulse signal generation circuit for generating a second pulse signal having a predetermined delay time from the first pulse signal;

a third pulse signal generation circuit for generating a third pulse signal having a predetermined delay time from the second pulse signal;

a fourth pulse signal generation circuit for generating a fourth pulse signal having a predetermined delay time from the third pulse signal;

said first, second, third, and fourth pulse signals each having respective active and inactive levels;

a first precharge signal generation circuit for generating the first precharge signal having an active level when said first, second and third pulse signals have an inactive level, the first precharge signal having an inactive level when the first pulse signal has the active level and second pulse signal has an inactive level and the reference clock signal has an active level; and a second precharge signal generation circuit for generating the second precharge signal having an active level when the third and fourth pulse signals have an inactive level, the second precharge signal having an inactive level when the third pulse signal has the active level;

said first and second precharge signal active levels corresponding to said first and second precharge signals being activated.

3. The semiconductor memory device according to claim 2, wherein each of said first to fourth pulse signal generation circuits comprises a flip-flop circuit.

4. The semiconductor memory device according to claim 2, wherein said second precharge signal generation circuit comprises a first logic gate having a first input terminal coupled to the fourth pulse signal, a second input terminal coupled to the third pulse signal and an output terminal outputting the second precharge signal.

5. The semiconductor memory device according to claim 2, wherein said first precharge signal generation circuit comprises:

a second logic gate having a first input terminal coupled to the third pulse signal, a second input terminal coupled to the second pulse signal, a third input terminal coupled to the first pulse signal and an output terminal outputting a set signal;

a third logic gate having a first input terminal coupled to the second pulse signal, a second input terminal coupled to the first pulse signal, a third input terminal coupled to the reference clock signal and an output terminal outputting a reset signal; and a set-reset type flip-flop circuit having a set terminal coupled to the set signal, a reset terminal coupled to the reset signal and an output terminal outputting the first precharge signal.

6. A semiconductor memory device comprising:

first and second word-lines;

a first bit-line path coupled between a first node and a second node and comprised of a first MOS transistor having a gate coupled to said first word-line, a first electrode coupled to the first node and a second electrode coupled to the second node;

a second bit-line path coupled between a third node and a fourth node and comprised of a second MOS transistor having a gate coupled to said second word-line, a third electrode coupled to the third node and a fourth electrode coupled to the fourth node;

a precharge signal generation circuit for generating a first precharge signal and a second precharge signal each of which has an active level and an inactive level, the first precharge signal having the active level between a first time and a second time, the second precharge signal having the active level between a third time after the first time and a fourth time after the second time;

a first precharge circuit for precharging said first and second word-lines to an active level in response to the first precharge signal having the active level;

a second precharge circuit for precharging said first and second bit-lines to an active level in response to the second precharge signal having the active level;

an output terminal;

a word-line decode and discharge circuit coupled to said first and second word-lines for discharging one of said first and second word-lines to an inactive level in response to a first address signal and the first precharge signal having an inactive level;

a bit-line decoder coupled to the first node, the third node and said output terminal for electrically connecting one of said first and second bit-lines to said output terminal in response to a second address signal; and a bit-line discharge circuit coupled to said second and fourth nodes for discharging said first and second bit-lines to an inactive level in response to the second precharge signal having the inactive level.

7. The semiconductor memory device according to claim 7, wherein said precharge signal generation circuit comprises:

a first pulse signal generation circuit for generating a first pulse signal;

a second pulse signal generation circuit for generating a second pulse signal having a predetermined delay time from the first pulse signal;

a third pulse signal generation circuit for generating a third pulse signal having a predetermined delay time from the second pulse signal;

a fourth pulse signal generation circuit for generating a fourth pulse signal having a predetermined delay time front the third pulse signal;

said first, second, third, and fourth pulse signals each having respective active and inactive levels;

a clock node coupled to receive a clock signal, said clock signal having an active level and an inactive level;

a first precharge signal generation circuit for generating the first precharge signal having the active level when the first, the second and the third pulse signals have the inactive level and the first precharge signal having the inactive level when the first pulse signal has the active level and the second pulse signal has the inactive level and the clock signal has the active level; and a second precharge signal generation circuit for generating the second precharge signal having the active level when the third and fourth pulse signals have the inactive level and the second precharge signal having the inactive level when the third pulse signal has the active level.

8. The semiconductor memory device according to claim 6, wherein each of said first to fourth pulse signal generation circuits comprises a flip-flop circuit.

9. The semiconductor memory device according to claim 6, wherein said second precharge signal generation circuit comprises a first logic gate having a first input terminal coupled to the fourth pulse signal, a second input terminal coupled to the third pulse signal and an output terminal outputting the second precharge signal.

10. The semiconductor memory device according to claim 6, wherein said first precharge signal generation circuit comprises:

a second logic gate having a first input terminal coupled to the third pulse signal, a second input terminal coupled to the second pulse signal, a third input terminal coupled to the first pulse signal and an output terminal outputting a set signal;

a third logic gate having a first input terminal coupled to the second pulse signal, a second input terminal coupled to the first pulse signal, a third input terminal coupled to the clock signal and an output terminal outputting a reset signal; and a set-reset type flip-flop circuit having a set terminal coupled to the set signal, a reset terminal coupled to the reset signal and an output terminal outputting the first precharge signal.

11. A method for reading data for a semiconductor memory device including steps of selecting a plurality of memory locations on which data are stored by word-lines and bit-lines, and reading the data from the bit-lines, the method comprising:

(a) precharging the word-lines to an active level and discharging the bit-lines to an inactive level in a first period;

(b) precharging the bit-lines to an active level and discharging the word-lines to an inactive level in a second period after the first period;

(c) selecting a predetermined memory location; and (d) reading data stored on the selected memory location from one of the bit-lines which corresponds to the selected memory location in a third period after the second period.

12. The method according to claim 11, wherein said step (a) comprises:

precharging the word-lines to the active level and discharging the bit-lines to the inactive level; and maintaining the active level of the precharged word-lines and precharging the bit-lines to the active level.

* * * * *